United States Patent [19]

Little et al.

[11] Patent Number: 4,857,767

[45] Date of Patent: Aug. 15, 1989

[54] HIGH-DENSITY LOW-POWER CIRCUIT FOR SUSTAINING A PRECHARGE LEVEL

[75] Inventors: Wendell L. Little, Carrollton; Michael D. Smith, Lewisville, both of Tex.

[73] Assignee: Dallas Semiconductor Corporation, Dallas, Tex.

[21] Appl. No.: 166,537

[22] Filed: Mar. 3, 1988

[51] Int. Cl.[4] .......................................... H03K 17/16
[52] U.S. Cl. .................................. 307/448; 307/443; 307/468; 307/481
[58] Field of Search ............... 307/448, 451, 465, 468, 307/469, 481, 297, 443; 323/315, 316; 330/288

[56] References Cited

U.S. PATENT DOCUMENTS

| | | | |
|---|---|---|---|
| 3,823,332 | 7/1974 | Feryszka et al. | 307/297 |
| 4,491,741 | 1/1985 | Parker | 307/450 X |
| 4,613,772 | 9/1986 | Young | 307/451 X |
| 4,645,952 | 2/1987 | van Tran | 307/450 X |

Primary Examiner—David Hudspeth
Attorney, Agent, or Firm—Worsham, Forsythe, Sampels & Wooldridge

[57] ABSTRACT

A high density pull-up circuit provides a sustaining pull-up voltage for a logic node such as, for example, a precharged column in a programmable logic array (PLA). The pull-up circuit employs a current source and a first current mirror circuit which in turn drives a plurality of second mirror transistors, each of the second mirror transistors being coupled between a positive supply voltage and one of the column lines of the PLA.

40 Claims, 2 Drawing Sheets

HIGH-DENSITY LOW-POWER CIRCUIT FOR SUSTAINING A PRECHARGE LEVEL

TECHNICAL FIELD

This invention relates to pull-up circuits, and more particularly, to pull-up circuits used with high density programmable logic arrays.

BACKGROUND OF THE INVENTION

Programmable logic arrays (PLAs) are used in many applications to realize logic functions involving a relatively large number of inputs and a relatively large number of outputs. The PLA is a matrix of row input lines which are selectively coupled to column output lines to form logical AND or logical OR functions, or combinations of logical AND and logical OR functions.

The major advantages of PLAs are that they are easily programmable and that they provide a highly dense layout of the logic functions on an integrated circuit chip. PLAs can also provide relatively low power logic, by using precharge signal to precharge the columns prior to enabling the row input signals. However, in prior art PLAs, once the columns have been precharged, the row inputs must be enabled and the column lines sampled relatively soon after the precharge is ended, or the precharge signal on the column lines may decay below the minimum voltage for a logical 1 level. For this reason, these PLAs are sometimes referred to as dynamic PLAs. However, there are conditions which call for high density, low power PLAs which also must operate in a static manner, since the time between the end of the precharge signal and the sampling period may vary widely.

Therefore, it can be appreciated that a circuit such as a high density pull-up circuit which enables a high density, low power PLA to operate as a static PLA is highly desirable.

SUMMARY OF THE INVENTION

It is therefore an object of this invention to provide a pull-up circuit for a high density, low power PLA which operates as a static PLA.

Shown in an illustrated embodiment of the invention is a pull-up circuit for a plurality of voltage nodes which includes a current source having a voltage output terminal which is coupled to a control terminal of a series transistor inside the current source. A like plurality of current mirror transistors, each coupled between one of said plurality of voltage nodes and a reference voltage has a control terminal thereof coupled to the output terminal of the current source.

BRIEF DESCRIPTION OF THE DRAWINGS

The aforementioned and other features, characteristics, advantages, and the invention in general will be better understood from the following, more detailed description taken in conjunction with the following drawings in which.

DESCRIPTION OF THE PREFERRED EMBODIMENT

A pull-up circuit of the present invention can be advantageously used to sustain the voltage on a column line of a programmable logic array (PLA) at the positive supply voltage, VCC, after the column line has been precharged. In the preferred embodiment the pull-up circuit includes a series combination of an upper p-channel transistor, a current setting resistor, and a lower n-channel transistor. The upper p-channel transistor is a switching transistor which is enabled or made conductive when the PLA circuitry is being used, and is disabled or made nonconductive when it is desired to reduce the power consumed by the PLA by turning off the current source. The lower n-channel transistor has its control terminal or gate connected back to its source. The gate of the lower n-channel transistor forms a voltage output terminal of this current source which is connected to the gate of an n-channel transistor in a current mirror circuit. The current mirror circuit includes an upper p-channel transistor having its gate connected to its drain in series with the n-channel transistor. The gate of the upper p-channel transistor is then connected to a plurality of additional p-channel current mirroring transistors, which are each connected to one of the column lines in the PLA. Thus the current in the current source circuit is mirrored twice to provide a current source between the VCC supply and each column line in the PLA. The amount of current supplied to each column line is enough to sustain the voltage in the column line at approximately the VCC supply voltage. In other words the current is sufficient to compensate for the leakage of the column line.

Figure 1:
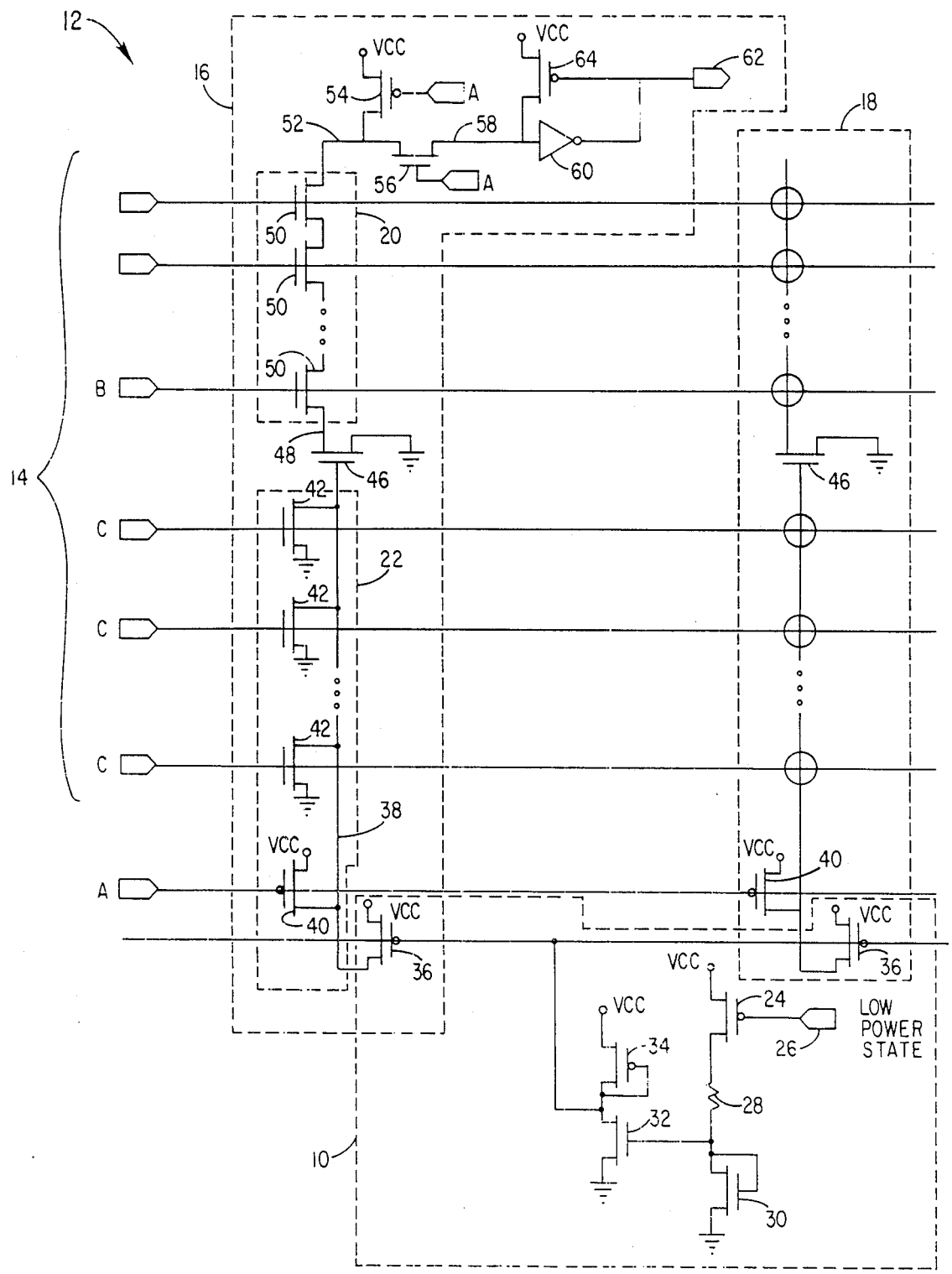
FIG. 1 is a schematic diagram of a portion of a programmable logic array having a pull-up circuit according to the present invention.

Turning now to the drawings, a pull-up circuit according to the present invention is contained within the outlined area 10 which is part of a PLA 12 shown in FIG. 1. The PLA 12 includes a plurality of row lines 14 which cross another plurality of column lines one of which is contained with the outlined area 16 and partially shown in the outlined area 18. Each of the column lines, for example column line 16, includes an upper logical AND section 20 and a lower logical OR section 22.

The pull-up circuit 10 includes an upper p-channel transistor 24, the source of which is connected to VCC and the gate of which is connected to a Low Power State input terminal 26. The drain of the p-channel transistor 24 is connected to one end of a resistor 28, the other end of which is connected to the drain and gate of an n-channel transistor 30, the source of which is connected to ground. The p-channel transistor 24, the resistor 28, and the n-channel transistor 30 form a current source, which, in the preferred embodiment, draws about one microamp of current. Connected to the gate of the n-channel transistor 30 is another n-channel transistor 32 the source of which is connected to ground and the drain of which is connected to the gate and drain of another p-channel transistor 34, the source of which is connected to VCC. The n-channel transistor 32 mirrors the current through the n-channel transistor 30 and draws about 200 nanoamps of current in the preferred embodiment. Connected to the gate of the p-channel transistor 34 is a plurality of p-channel transistors 36, the sources of which are connected to VCC and the drains of which are each connected to one of the columns of the PLA 12. More specifically, the drains of each of the transistors 36 is connected to a lower column node 38 of the logical AND section 22 of each column in the PLA 12. The p-channel transistors 36 mirror the current flowing through the p-channel transistor 34 and each provides about 8 nanoamps of current when the lower column node 38 is at ground potential, and of course provides no current when the lower column node 38 is at VCC.

Also connected to the lower column node 38 is a p-channel precharge transistor 40, the gate of which is connected to a signal A and the source of which is connected to VCC. The lower column node 38 has connected to it a plurality of parallel n-channel logical ORing transistors 42 which are contained within the logical OR section 22. For simplicity these logical ORing transistors 42 have not been shown in the partial schematic of the column 18, but are represented by circles to indicate their presence. The sources of each of the n-channel logical ORing transistors 42 is connected to ground, and the gates are selectively connected to one of the row lines 14 depending on the specific logic function to be implemented. Each of the row lines 14 passing through the logical ORing section 22 is driven by a signal C as shown in FIG. 1.

The lower column node 38 is connected to the gate of an n-channel transistor 46. The source of transistor 46 is connected to ground, and the drain of transistor 46 forms a node 48. Node 48 is connected to the source of the lower transistor of a series of n-channel logical ANDing transistors 50. These transistors 50 form the logical AND section 20 of the PLA 12. The gates of the logical ANDing transistors 50 are selectively connected to the row lines 14 running through the logical AND section 20 of the columns of the PLA 12.

The drain of the upper logical ANDing transistor 50 is connected to a node 52, which in turn is connected to the drain of another p-channel precharge transistor 54. The source of transistor 54 is connected to VCC, and the gate of transistor 54 is connected to the signal A. The node 52 is also connected to the source of another n-channel transistor 56, the drain of which is connected to a node 58, and the gate of which is connected to the signal A. The node 58 is connected to the input of an inverter 60. The output of invertor 60 is connected to an output terminal 62 and also to the gate of a p-channel transistor 64. The source of transistor 64 connected to VCC, and its dram is connected back to the node 58.

Figure 2:
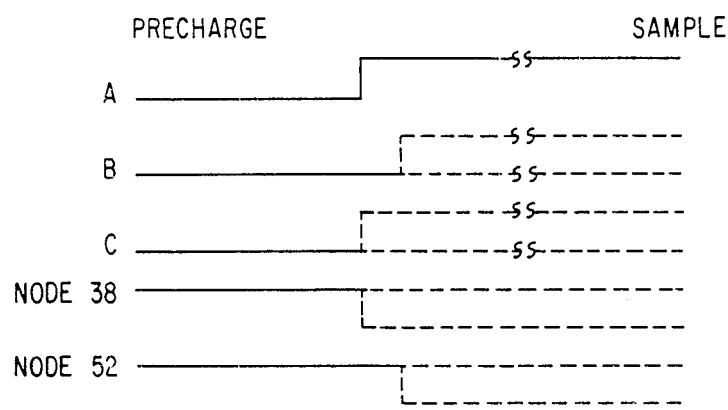
FIG. 2 is a timing diagram of some of the voltages present in the circuit shown in FIG. 1.

In operation, and with reference now to FIGS. 1 and 2, the PLA 12 is first precharged by applying a logical 0 level to the A inputs. This low logic level enables the precharge transistors 40 and 54 which in turn pulls the lower column node 38 and the node 52 to VCC. The low logic level on the gate of the n-channel transistor 56 isolates the node 52 from the node 58. In order for the lower column node 38 to be precharged to VCC, the signal C on each of the row lines 14 running through the logical OR section 22 must also be at a logical 0 level to disable the parallel ORing transistors 42. In addition, the signal B, on at least one of the upper row lines 14 (which run through the logical AND section 22) must be at a logical 0 level, to isolate node 52 from node 48 (since transistor 46 is conductive as a result of the VCC voltage on its gate.) After the precharge operation, the signal A is brought low, thereby disabling the p-channel precharge transistors 40 and 54, and also enabling the n-channel transistor 56 (and thereby coupling the node 52 to the node 58.)

Later, when the logic function is to be performed, the signals appearing on lines B and C are brought to the proper logic levels of the input signals. However, and significantly, the logic levels on the row lines 14 passing through the logical ORing section 22 are allowed to go to a logical 1 level prior to the time that the row lines 14 in the AND section 2, (driven by the B signals) are allowed to go to a logical 1 level. This preserves the precharge signal on the node 52. If the B signals were to go to a logical 1 level before the row lines driving the lower ORing section 22 were at the proper logic level, then transistor 46 could discharge node 52 regardless of the logic state of the C signals (on the row lines 14 passing through the logic OR section 22), and thereby possibly provide a false output at the output terminal 62.

After B signals have gone to their proper logic level, then the logic level of the lower column node 38 will be a logical 1 level if all of the C signals (on the row lines 14 passing through the logical OR section 22) are at a logical 0 level, and node 38 will be a logical 0 level if one of these C signals section is at a logical 1 level. If the node 38 is at a logical 0 level, then the n-channel transistor 46 will be disabled and the node 52 will remain at a logical 1 level. However, if the lower column node 38 is at a logical 1 level, then transistor 46 will be enabled, and node 52 will be at a logical 0 level if all of the C signals are at a logical 1 level, otherwise node 52 will remain at a logical 1 level.

The logic level at the node 52 is passed through the n-channel transistor 56 to node 58, and then inverted by the inverter 60 and output at the output terminal 62. The p-channel transistor 64 operates to hold the node 58 at a logical 1 level when the output of the inverter 60 is at a logical 0 level.

As described above, the current source 10 operates at all times to supply a small amount of current from VCC through the p-channel current mirror transistors 36 onto the lower column node 38. Thus if there is a significant amount of time between the precharge and the application of the proper signals on the row lines 14, the pull-up circuit 10 will operate to hold the voltage on column node 38 at a VCC level. The voltage at the node 52 is held at a logical 1 level after the precharge operation by the p-channel transistor 64, since the drain of the p-channel transistor is coupled to the node 52 through the n-channel transistor 56.

The pull-up circuit 10 allows for high density packing of the PLA 12, since only a single p-channel transistor 36 is required for each of the column lines (such as column lines 16 and 18). This circuitry is a significant savings of area on a semiconductor chip as compared to a more conventional pull-up circuit such as cross-coupled inverter circuits.

Therefore there has been described a high density pull-up circuit for use in a high-density, low power PLA which operates as a static PLA.

Although the invention has been described in part by making detailed reference to a certain specific embodiment, such detail is intended to be, and will be understood to be, instructional rather than restrictive. It will be appreciated by those skilled in the art that many variations may be made in the structure and mode of operation without departing from the spirit and scope of the invention, as disclosed in the teachings contained herein.

What is claimed is:

1. A pull-up circuit for a plurality of voltage nodes, comprising:

a first current source having a pull-up transistor and a voltage output terminal coupled to a control terminal of said pull-up transistor; and a plurality of current mirror transistors, each coupled between a respective one of said voltage nodes and a reference voltage, the control terminal of each of said current mirror transistors being coupled to said voltage output terminal of said first current source;

a second current source having a pull-down transistor and a voltage output terminal coupled to a control terminal of said pull-down transistor; and said first current source containing a current setting transistor, the control terminal of which is coupled to said voltage output terminal of said second current source.

2. The circuit of claim 1, wherein said second current source further comprises a current-setting element connected in series with said pull-down transistor thereof.

3. The circuit of claim 2, wherein said current-setting element is a resistor.

4. The circuit of claim 1, wherein said pull-down transistor of said second current source passes much more current than said current-setting transistor of said first current source.

5. The circuit of claim 4, wherein said pull-down transistor of said second current source passes approximately five times as much current as said current-setting transistor of said first current source.

6. The circuit of claim 1, wherein said pull-up transistor of said first current source passes much more current than each of said current mirror transistors.

7. The circuit of claim 6, wherein said pull-up transistor of said first current source passes approximately 25 times as much current as each of said current mirror transistors.

8. The circuit of claim 1, wherein said pull-down transistor of said second current source passes much more current than said current-setting transistor of said first current source, and said pull-up transistor of said first current source passes much more current than each of said current mirror transistors.

9. The circuit of claim 8, wherein said pull-down transistor of said second current source passes approximately five times as much current as said current-setting transistor of said first current source, said pull-up transistor of said first current source passes approximately 25 times as much current as each of said current mirror transistors.

10. A pull-up circuit for a plurality of voltage nodes, comprising:

a first current source having a pull-up transistor and a voltage output terminal coupled to a control terminal of said pull-up transistor; and a plurality of current mirror transistors, each coupled between a respective one of said voltage nodes and a reference voltage, the control terminal of each of said current mirror transistors being coupled to said voltage output terminal of said first current source;

an input terminal for receiving a logic signal; and means coupled to said input terminal and to said first current source for disabling said first current source upon receipt of a predetermined logic signal at said first input terminal.

11. A pull-up circuit for a plurality of voltage nodes, comprising:

a first current source having a pull-up transistor and a voltage output terminal coupled to a control terminal of said pull-up transistor; and a plurality of current mirror transistors, each coupled between a respective one of said voltage nodes and a reference voltage, the control terminal of each of said current mirror transistors being coupled to said voltage output terminal of said first current source;

an input terminal for receiving a logic signal;

means coupled to said input terminal and to said first current source for disabling said first current source upon receipt of a predetermined logic signal at said first input terminal; and a second current source having a pull-down transistor, and a voltage output terminal coupled to a control terminal of said pull-down transistor;

wherein said first current source contains a current setting transistor, the control terminal of which is coupled to said voltage output terminal of said second current source;

and wherein said disabling means comprises means for disabling said second current source.

12. The circuit of claim 11, wherein said disabling means comprises a PMOS transistor in series with said pull-down transistor, and further comprising a current-setting element connected in series with said disabling means.

13. The circuit of claim 11, wherein said pull-down transistor of said second current source passes much more current than said current-setting transistor of said first current source.

14. The circuit of claim 13, wherein said pull-down transistor of said second current source passes approximately five times as much current as said current-setting transistor of said first current source.

15. The circuit of claim 11, wherein said pull-up transistor of said first current source passes much more current than each of said current mirror transistors.

16. The circuit of claim 15, wherein said pull-up transistor of said first current source passes approximately 25 times as much current as each of said current mirror transistors.

17. The circuit of claim 11, wherein said pull-down transistor of said second current source passes much more current than said current-setting transistor of said first current source, and said pull-up transistor of said first current source passes much more current than each of said current mirror transistors.

18. The circuit of claim 17, wherein said pull-down transistor of said second current source passes approximately five times as much current as said current-setting transistor of said first current source, said pull-up transistor of said first current source passes approximately 25 times as much current as each of said current mirror transistors.

19. A circuit for sustaining the voltage on a plurality of nodes, comprising:

a current source circuit, comprising
a current-setting element, and
a first field-effect transistor, connected in series with said current-setting element,
said current-setting element and said first field-effect transistor being operatively connected in series between a first power supply voltage and a second supply voltage;

a current mirror circuit, comprising a current-setting field-effect transistor, having a gate connected to the gate of said first transistor of said current source circuit, and a second field-effect transistor, operatively connected in series between said current-setting transistor and a first power supply voltage;

a plurality of mirroring field-effect transistors, each connected between a respective one of said nodes and said first power supply voltage, all of said mirroring transistors having respective gate terminals which are connected in parallel to said gate terminal of said second field-effect transistor of said current mirror circuit.

20. The circuit of claim 19, wherein said current-setting element of said current source circuit is a resistor.

21. The circuit of claim 19, wherein said first field-effect transistor of said current source circuit has the same conductivity type as said current-setting field-effect transistor of said current mirror circuit, and wherein all of said mirroring transistors have the same conductivity type as said second field-effect transistor of said current mirror circuit.

22. The circuit of claim 21, wherein said first field-effect transistor of said current source circuit and said current-setting field-effect transistor of said current mirror circuit both have a first conductivity type, and wherein all of said mirroring transistors and said second field-effect transistor of said current mirror circuit all have a conductivity type which is opposite to said first conductivity type.

23. The circuit of claim 19, wherein said first transistor of said current source circuit passes much more current than said current-setting transistor of said current mirror circuit, and said second transistor of said current mirror circuit passes much more current than the individual ones of said plural mirroring transistors.

24. The circuit of claim 23, wherein said first transistor of said current source circuit passes approximately five times as much current as said current-setting transistor of said current mirror circuit, and said second transistor of said current mirror circuit passes approximately 25 times as much current as the individual ones of said plural mirroring transistors.

25. The circuit of claim 19, wherein said power supply voltage is a positive voltage, and said second power supply voltage is ground voltage.

26. A circuit for sustaining the voltage on a plurality of nodes, comprising:
a current source circuit, comprising
a current-setting element, and
a first NMOS transistor, which has a gate terminal tied to a drain terminal thereof,
said current-setting element and said first NMOS transistor being operatively connected in series between an upper power supply voltage and a lower supply voltage;
a current mirror circuit, comprising
a current-setting NMOS transistor, having a gate connected to the gate of said first NMOS transistor, and
a PMOS pull-up transistor,
said current-setting NMOS transistor and said PMOS pull-up transistor being operatively connected in series between said upper power supply voltage and said lower supply voltage;
a plurality of mirroring PMOS pull-up transistors, each connected between a respective one of said nodes and said first power supply voltage, all of said mirroring PMOS transistors having respective gate terminals which are connected in parallel to said gate terminal of said PMOS pull-up transistor of said current mirror circuit.

27. The circuit of claim 26, further comprising a plurality of precharge transistors, each connected in parallel with a respective one of said mirroring field-effect transistors, plural ones of said precharge transistors being connected in common to be turned on by a precharge signal.

28. The circuit of claim 26, wherein said current-setting element of said current source circuit is a resistor.

29. The circuit of claim 26, wherein said first transistor of said current source circuit passes much more current than said current-setting transistor of said current mirror circuit, and said pull-up transistor of said current mirror circuit passes much more current than the individual ones of said plural mirroring transistors.

30. The circuit of claim 29, wherein said first transistor of said current source circuit passes approximately five times as much current as said current-setting transistor of said current mirror circuit, and said pull-up transistor of said current mirror circuit passes approximately 25 times as much current as the individual ones of said plural mirroring transistors.

31. An integrated circuit logic array, connectable to receive first and second power supply voltages and plural signal inputs, comprising:
a plurality of columns, multiple ones of said columns each containing
an output buffer,
a first section, containing multiple transistors connected in parallel between a common node and a second power supply voltage, multiple ones of said transistors being separately connected to be controlled by respective incoming logic signals;
a second section, containing multiple transistors operatively connected in series between said common node of said first section and said output buffer, multiple ones of said transistors being separately connected to be controlled by respective incoming logic signals;
a precharge transistor, connected to precharge said common node of said first section toward said first power supply voltage in accordance with the state of a precharge signal line; and
a sustaining transistor, connected to provide a regulated maximum current from said first power supply to said common node of said OR section;
a current source circuit, comprising
a current-setting element, and
a first field-effect transistor, connected in series with said current-setting element,
said current-setting element and said first field-effect transistor being operatively connected in series between a first power supply voltage and a second supply voltage;
a current mirror circuit, comprising
a current-setting field-effect transistor, having a gate connected to the gate of said first transistor of said current source circuit, and
a second field-effect transistor, operatively connected in series between said current-setting transistor and a first power supply voltage;
wherein multiple ones of said sustaining transistors have respective gate terminals which are commonly connected to said gate terminal of said second field-effect transistor of said current mirror circuit;

whereby said sustaining transistors can maintain a precharged voltage on said respective common nodes, after said precharge transistors have turned off.

32. The logic array of claim 31, further comprising an additional transistor, in each of said columns, which is connected to the input of said output buffer, and which is connected to maintain a precharged voltage on the input of each said respective buffer, after said precharge transistors turn off, until a signal is provided to said buffer from said first and second sections.

33. The array of claim 31, wherein said current-setting element of said current source circuit is a resistor.

34. The array of claim 31, wherein said first transistor of said current source circuit passes much more current than said current-setting transistor of said current mirror circuit, and said second transistor of said current mirror circuit passes much more current than the individual ones of said plural mirroring transistors.

35. The array of claim 34, wherein said first transistor of said current source circuit passes approximately five times as much current as said current-setting transistor of said current mirror circuit, and said second transistor of said current mirror circuit passes approximately 25 times as much current as the individual ones of said plural mirroring transistors.

36. The array of claim 31, wherein said first field-effect transistor of said current source circuit has the same conductivity type as said current-setting field-effect transistor of said current mirror circuit, and wherein all of said mirroring transistors have the same conductivity type as said second field-effect transistor of said current mirror circuit.

37. The array of claim 36, wherein said first field-effect transistor of said current source circuit and said current-setting field-effect transistor of said current mirror circuit both have a first conductivity type, and wherein all of said mirroring transistors and said second field-effect transistor of said current mirror circuit all have a conductivity type which is opposite to said first conductivity type.

38. The array of claim 31, wherein said first power supply voltage is a positive voltage, and said second power supply voltage is essentially ground voltage.

39. A low-power integrated circuit logic array, connectable to receive first and second power supply voltages and plural signal inputs, comprising:
  a plurality of columns, multiple ones of said columns each containing
    an output buffer,
    an OR section, containing multiple transistors connected in parallel between a common node and a second power supply voltage, multiple ones of said transistors being separately connected to be controlled by respective incoming logic signals;
    an AND section, containing multiple transistors operatively connected in series between said common node of said first section and said output buffer, multiple ones of said transistors being separately connected to be controlled by respective incoming logic signals;
    a precharge transistor, connected to precharge said common node of said OR section toward said first power supply voltage in accordance with the state of a precharge signal line; and
    a sustaining transistor, connected to provide a regulated maximum current from said first power supply to said common node of said OR section;
  wherein said sustaining transistors are connected to provide a small current which substantially maintains a precharged voltage on said respective common nodes, after said precharge transistors have turned off.

40. The array of claim 39, wherein said first power supply voltage is a positive voltage, and said second power supply voltage is essentially ground voltage.

* * * * *